United States Patent
Buxton et al.

(10) Patent No.: US 11,704,061 B2
(45) Date of Patent: Jul. 18, 2023

(54) PAGE BUFFER ENHANCEMENTS

(71) Applicant: Kioxia Corporation, Minato (JP)

(72) Inventors: Neil Buxton, Berkshire (GB); Avadhani Shridhar, San Jose, CA (US); Steven Wells, Rancho Cordova, CA (US); Nicole Ross, Folsom, CA (US)

(73) Assignee: Kioxia Corporation, Tokyo (JP)

( * ) Notice: Subject to any disclaimer, the term of this patent is extended or adjusted under 35 U.S.C. 154(b) by 32 days.

(21) Appl. No.: 17/203,392

(22) Filed: Mar. 16, 2021

(65) Prior Publication Data

US 2022/0300199 A1    Sep. 22, 2022

(51) Int. Cl.
*G06F 3/06* (2006.01)
*G11C 16/04* (2006.01)
*G11C 11/56* (2006.01)

(52) U.S. Cl.
CPC .......... *G06F 3/0659* (2013.01); *G06F 3/0604* (2013.01); *G06F 3/0656* (2013.01); *G06F 3/0679* (2013.01); *G11C 16/0483* (2013.01); *G11C 11/56* (2013.01)

(58) Field of Classification Search
CPC .... G06F 3/0659; G06F 3/0604; G06F 3/0656; G06F 3/0679; G11C 16/0483; G11C 11/56
See application file for complete search history.

(56) References Cited

U.S. PATENT DOCUMENTS

| | | | | |
|---|---|---|---|---|
| 8,307,241 B2* | 11/2012 | Avila | ..................... | G11C 29/82 |
| | | | | 714/6.2 |
| 9,153,332 B2* | 10/2015 | Lee | ........................... | G11C 8/20 |
| 9,529,668 B2* | 12/2016 | Wakchaure | ......... | G06F 12/0868 |
| 10,901,622 B2* | 1/2021 | Cariello | ................ | G06F 3/0685 |
| 2013/0185609 A1* | 7/2013 | Park | ..................... | G06F 11/0751 |
| | | | | 714/E11.023 |
| 2021/0351196 A1* | 11/2021 | Cheng | ................. | H01L 27/0688 |

* cited by examiner

*Primary Examiner* — Idriss N Alrobaye
*Assistant Examiner* — Richard B Franklin
(74) *Attorney, Agent, or Firm* — Allen & Overy LLP

(57) ABSTRACT

A memory storage system comprising a non-volatile semiconductor memory device comprising a memory array and a plurality of buffers, and a controller in communication with the plurality of buffers. The controller may be configured to issue a command to the non-volatile semiconductor memory device to cause a transfer of a data payload from the controller to a subset of n first buffers of the plurality of buffers. The controller may also be configured to issue a command to the non-volatile semiconductor memory device to cause the non-volatile memory device to transfer a data payload from the memory array to a subset of n first buffers of the plurality of buffers.

39 Claims, 9 Drawing Sheets

PAGE BUFFER ENHANCEMENTS

FIELD

The present disclosure relates to a memory storage system and methods that utilize page buffers within a non-volatile semiconductor memory device to enhance operation of the memory storage device.

BACKGROUND

Memory storage systems such as solid-state drives (SSDs) generally have faster performance, are more compact, and are less sensitive to vibration or physical shock than conventional magnetic disk drives. Given these advantages, SSDs are being used in more and more computing devices and other consumer products in lieu of or in addition to magnetic disk drives, even though the cost-per-gigabyte storage capacity of SSDs is significantly higher than that of magnetic disk drives. SSDs utilize physical memory cells that comprise non-volatile semiconductor storage devices, such as NAND flash memory devices, to store data. A controller is used in an SSD to manage the transfer of data between a host and the memory cells of the SSD. Writing data to and reading data from the physical memory cells of an SSD typically involves transferring data between a host external to the SSD and the non-volatile semiconductor storage devices.

SSDs are subject to large volumes of data traffic as they receive multiple read and write requests from the host. Such host requests are in the form of commands that include logical address information, such as logical block addresses (LBAs) and namespace identifiers (NSIDs), which the SSD converts to a physical address (e.g. a NAND memory page address) in the non-volatile semiconductor storage devices. The SSD uses the physical NAND address to fulfil the request (e.g. a read of data from the non-volatile semiconductor storage devices). However the movement of large amounts of data to and from the NAND memory often requires the memory controller to temporarily store the data while the NAND memory device completes its current activities, especially in the case of write commands involving the transfer of data that has yet to be stored.

In such situations, the memory controller uses its internal volatile memory to temporarily store such data. If necessary, external volatile memory is adopted if the size of the internal volatile memory is not sufficient to hold the volume of data being transferred. The use of these resources of the SSD to effectively serve as a buffer or cache memory to manage the transfer of data into and out of the NAND memory device reduces the capabilities of the controller to perform other tasks with such resources. Data may be held in the buffer until the NAND memory device confirms the transfer and/or programming of data has successfully completed, resulting in large amounts of buffer space being allocated and held for long periods of time. Additionally, such internal volatile memories do not scale with the size and number of the NAND memory device(s). Thus for high data rates and large data transfers, a large quantity of volatile memory is required, which increases the cost of the SSD, and places additional burdens on the controller and the NAND bus, for example. This imposes challenges on how to efficiently manage read or program/write commands involving large data transfers within a memory storage system.

SUMMARY

According to an embodiment of the present disclosure there is provided a memory storage system comprising a non-volatile semiconductor memory device comprising a memory array and a plurality of buffers. The memory storage system also comprises a controller in communication with the plurality of buffers, and configured to issue a first command to the non-volatile semiconductor memory device to cause a transfer of a data payload from the controller to a subset of n first buffers of the plurality of buffers.

In some implementations, the controller is further configured to issue a second command to the non-volatile semiconductor memory device to cause the data payload in the subset of n first buffers to be encoded in n second buffers of the plurality of buffers separate from the n first buffers, and stored in the memory array. In certain implementations, the controller is further configured to issue a third command to the non-volatile semiconductor memory device to cause the transfer of the unencoded data payload directly from the first n buffers to the controller. In other implementations, the controller is further configured to issue a third command to the non-volatile semiconductor memory device to cause the transfer of the unencoded data payload directly from the n first buffers to the controller when the controller is in receipt of any one of: a notification of a program status fail (PSF) signal, and notification of a power loss event. In further implementations, the first command and the second command are combined into a single command issued by the controller. In some implementations, the controller is configured to re-encode the data payload for a pseudo single layer cell (pSLC) to be written in the memory array.

In certain implementations, the controller is configured to process data payloads from a plurality of programs, and accumulate data payloads relating to each program in a plurality of n third buffers of the plurality of buffers separate from the first buffers, and wherein the first command initially causes a transfer of data payloads from the n third buffers relating to a program m of the plurality of programs to the subset of n first buffers. In other implementations, the controller is further configured to issue a second command to the non-volatile semiconductor memory device to cause the data payload for program m in the n first buffers to be stored in the memory array. In further implementations, the controller is configured to issue a third command to transfer a data payload directly from the plurality of n third buffers associated with a program to the controller. In other implementations, the plurality of programs may comprise any one of: a host program, a garbage collection program, and a management program.

In further implementations, upon receipt of a notification of a power loss event, the controller is configured to issue a reset command to the non-volatile semiconductor memory device, re-encode the data payload contained in the plurality of n first buffers as pSLC, and program the pSLC encoded data payload to the memory array. In some implementations, if the data payload contained in the plurality of n first buffers has already been encoded to be programmed to the memory array, the controller is further configured to issue new commands to re-encode the data payload in each of the n first buffers as pSLC. In certain implementations, if the data payload contained in the plurality of n first buffers has not already been encoded to be programmed to the memory array, the controller is further configured to issue a third command to transfer the data payload to the controller, followed by a first command to transfer the same data payload to the plurality of n first buffers as pSLC.

In other implementations, the first command causes transfer of a data payload to a subset of n first buffers of the plurality of buffers for each memory cell of the memory array within a disturb distance of d cells. In some implementations, for each step in a programming cycle comprising z steps, the controller is further configured to issue a second command to the non-volatile semiconductor memory device to cause a data payload in a subset of n first buffers of the n×d first buffers to be encoded in n second buffers of the plurality of buffers separate from the first buffers, and stored in the memory array. In certain implementations, the programming cycle comprises two or more steps for programming.

According to another embodiment of the present disclosure there is provided a memory storage system comprising a non-volatile semiconductor memory device comprising a memory array and a plurality of buffers. The memory storage system also comprises a controller in communication with the plurality of buffers, and configured to issue a fourth command to the non-volatile semiconductor memory device to cause the non-volatile memory device to transfer a data payload from the memory array to a subset of n first buffers of the plurality of buffers.

In certain implementations, the controller is further configured to issue a third command to cause the transfer of the data payload contained in the subset of n first buffers to the controller. In further implementations, the controller is configured to determine an address of the data payload in the memory array, and a plurality of subsequent sequential addresses in the memory array for a specified queue depth, and transfer data payloads at each of the subsequent sequential addresses to a plurality of n fourth buffers of the plurality of buffers separate from the n first buffers. In other implementations, the controller is configured to issue a third command to the non-volatile semiconductor memory device to cause the transfer of a data payload associated with a subsequent sequential address directly from a respective plurality of n fourth buffers to the controller. In some implementations, the memory array comprises memory cells that each store at least one bit per cell. In certain implementations, the third command and the fourth command are combined into a single command issued by the controller.

In further implementations, the memory array comprises memory cells that each store at least one bit per cell. In certain implementations, the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs). In further implementations, the non-volatile semiconductor memory device is a CMOS under Array (CuA) NAND semiconductor memory. In other implementations, the controller comprises a system-on-chip (SoC) controller.

BRIEF DESCRIPTION OF DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Figure 1:
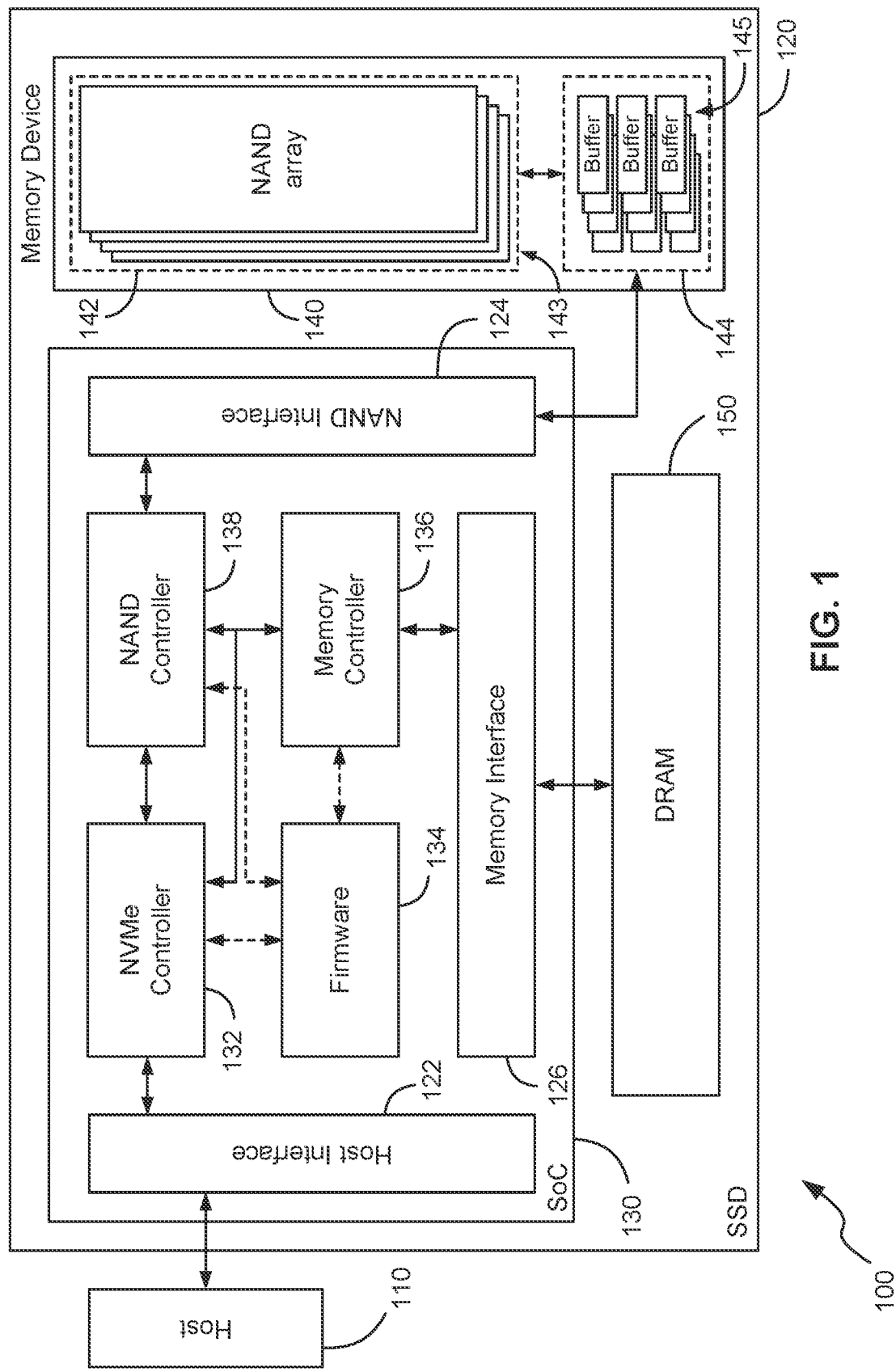
FIG. 1 shows a schematic representation of a memory storage system, such as an SSD, configured according to one or more embodiments of the present disclosure.

To provide an overall understanding of the systems and methods described herein, certain illustrative embodiments will be described. Although the embodiments and features described herein are specifically described for use in connection with a memory storage system, such as an SSD, having a controller and a memory device with internal page buffers, it will be understood that all the components and other features outlined below may be combined with one another in any suitable manner and may be adapted and applied to other types of memory systems to enhance the performance of said systems by employing the internal page buffers of the memory device.

Three dimensional (3D) NAND arrays have recently been attracting attention as they offer increased data handling capabilities due to the vertical stacking of NAND layers resulting in a compact footprint. Memory devices incorporating 3D NAND arrays are fast, more efficient and consume less energy than conventional NAND arrays. More recent generations of the 3D NAND arrays build a vertical stack of NAND layers over the interface, command and control logic circuitry of the NAND chip, instead of at the periphery of the array which increases the semiconductor die size of the NAND array. In some instances, such interface, command and control circuitry utilizes complementary metal-oxide-semiconductor (CMOS) technology resulting in a CMOS under Array (CuA) NAND memory device. This enhanced memory architecture provides a CuA NAND array with approximately 25% more die per wafer relative to a 64-layer 3D NAND array. The CMOS logic circuitry also facilitates optimization of the NAND architecture by potentially adding a large number of NAND page buffers in the CMOS area of a CuA NAND memory device. Implemented in this manner, the number of NAND page buffers could scale with the size of the NAND memory, where the NAND page buffers could be configured for homogeneous use, being repurposed as necessary to suit the requirements of the memory storage system. The availability of NAND page buffers within the CuA NAND memory device would alleviate the burden placed on the volatile memory of the memory controller when processing commands involving large data transfers.

The present disclosure describes systems and methods that utilize the NAND page buffers in a NAND memory device, such as a CuA NAND memory device, for example, to enhance the performance of a memory storage system. While implementations using NAND page buffers in a CuA NAND memory device are disclosed, the systems and methods described herein may be used with any memory technology that provides data buffers in the interface circuitry between a controller and a memory array. In an embodiment, a subset of the page buffers may serve as private buffers in which a data payload from the controller is transferred prior to being encoded in a programming buffer (for a memory cell type such as triple layer cell (TLC)) and stored in the NAND array. By using a subset of page buffers in this manner, the original payload is not corrupted by the encoding and is readily available should the controller require the payload for a subsequent media read operation, or if the program operation fails for any reason and is required to be repeated.

In another embodiment, a subset of the NAND page buffers may serve as program context buffers for each program context (e.g. host program, garbage collection and management), and data payloads for each context may be accumulated in the assigned context buffers. When all the data for a specific program context has been received, the data payload in the context buffers for that specific program context is transferred to the program buffers for storage in the NAND array. By adopting NAND buffers as context buffers, the controller resources (e.g. volatile memory) are freed up for other purposes.

In a further embodiment, when the controller is notified of a power failure, the NAND page buffers are used to shift-out data payloads involved in a program operation that have yet to be encoded for programming to the NAND array. The data payload is returned to the controller where a shift-in command is issued to encode the data payload in quickly encoded for pseudo single layer cell (pSLC) and stored in the NAND array. This quick action using the NAND page buffers allows the controller to program the payload in the NAND array in the short time from notification of the power failure to when the memory storage system has no power left.

In yet another embodiment, the NAND page buffers may be used for multi-step programming, where the NAND buffers are used to store data payloads for programming to a plurality of memory cells of the memory array within a disturb distance. Here for each step of the multi-step programming, the controller pulls data from the data payloads stored in the NAND page buffers. In this manner the original data payloads in the NAND page buffers are maintained as received from the controller without having to request the data payload again, which would undoubtedly involve shifting in of data payloads and re-reading the data payloads into the NAND array which, in turn, would unnecessarily introduce additional delays.

In another embodiment, the NAND page buffers may serve as pre-fetch buffers for sequential read operations where the NAND address of a data payload in a read operation is used to obtain a series of sequential address and the data payloads at those sequential addresses are transferred from the memory array to the pre-fetch buffers. In this manner, when a read operation is received from the controller requesting a data payload from said sequential address, the data payload would be readily available in the pre-fetch buffer for immediate decode and transfer to the controller without incurring additional read delays from the NAND array, since the read period of the address in sequence is taking place in parallel with the shift-out of data to the controller of the first read operation. This also minimizes the frequency with which the memory array is accessed, thereby limiting read disturb errors.

FIG. 1 is a block diagram of a computing system 100 comprising at least one host 110 in communication with a solid-state device (SSD) 120, according to an embodiment of the present disclosure. The host 110 is a computing system that comprises processors or cores, a controller, a memory, and other components as is generally known in the art, and which are not shown in FIG. 1 for the sake of brevity. SSD 120 provides non-volatile storage functionality for use by the host 110. SSD 120 may include an integrated circuit comprising a controller. Such an integrated circuit may also be referred to as a system-on-chip (SoC) controller 130. SoCs are advantageous in SSDs as they provide a single integrated circuit that contains all the required circuitry and components of the electronic system required for the SSD to function. The SoC therefore eliminates the need for a modular discrete component architecture connected by a plurality of busses and buffers.

SoC controller 130 is communicatively coupled to a non-volatile semiconductor-based storage device 140 (while a single device is shown for clarity, there may be a whole array of devices which the controller 130 is communicatively coupled to, such as NAND-based flash memory devices) as the storage medium. The storage medium may comprise a plurality of NAND devices, such as, for example, 32, 64, 128, 256 separate NAND devices, and each NAND device can be running separate commands on planes of individual dies (not shown) within the device. As an example, an array of storage device 140 comprising x NAND devices each with y dies may be servicing up to (x×y) commands from the SoC controller 130 at any one time, where x and y are integers greater than zero. According to an embodiment of the present disclosure, non-volatile semiconductor-based storage device 140 may comprise a three-dimensional (3D) NAND device such as a complementary metal-oxide-semiconductor (CMOS) under array (CuA) memory device, as will be described in further detail below. Generally, a CuA memory device comprises a memory array 142 of NAND planes 143 built vertically over the interface, command and control circuitry 144 for the storage device 140. In some implementations, the interface, command and control circuitry 144 may comprise a plurality of homogenous NAND page buffers 145 that can be used for multiple purposes associated with the NAND array 142. In certain implementations, some of the NAND page buffers may be configured as any one of: program buffers, private buffers, context buffers, and pre-fetch buffers, as will be described in greater detail in the following disclosure.

Generally the present disclosure includes a memory device having memory cells that store n bits per cell, where n is an integer. For example, the memory cells may be single-level memory cell (SLCs) where n=1, pseudo single-level memory cells (pSLCs) where n=1, multi-level memory cells (MLC) where n=2, triple-level memory cells (TLCs) where n=3, quad-level memory cells (QLCs) where n=4, or variable-level memory cells (VLCs) where n=5. Further, while the present disclosure has been described for a NAND memory storage device with SLC, pSLC, MLC, TLC, QLC or VLC memory arrays using CuA technology, it will be understood that the systems and methods disclosed herein may be applicable to any memory technology where interface buffers for transferring data in/out of a memory array are employed, such as, but not limited to, CuA NAND memory, non-CuA NAND memory, phase-change memory (PCM), magnetoresistive random-access memory (MRAM), and ferroelectric random-access memory (FeRAM).

SSD 120 also includes a volatile memory external to the SoC controller 130, such as a dynamic random access memory ("DRAM") 150. DRAM 150 comprises several buffers (not shown) which are conventionally used to buffer data during read and write operations between the host 110 and the storage devices 140 upon receipt of commands from the host 110. It should be noted that unlike the NAND page buffers 145 in the storage device 140, the DRAM 150 memory can be flexibly allocated and de-allocated for whatever buffering or temporary storage purpose the controller 130 requires.

Volatile memories are used in connection with the controller as they are fast and responsive. However the contents stored in volatile memories are lost when power is removed. Volatile memories are also expensive, and thus increase the overall cost of the SSD. In some implementations, the whole or a part of the external memory DRAM 150 may be located within the SoC controller 130. When located within the SoC controller 130, at least a portion of the external memory may be implemented using a fast memory technology, such as static random access memory (SRAM). In some implementations, the portion of the DRAM located within the SoC 130 may be implemented as a cache. In certain implementations the whole or a part of the external memory may be implemented using a fast non-volatile memory technology, including, but not limited to, magnetic random access memory (MRAM), resistive random access memory (Re-RAM) or phase change memory (PCM).

SoC controller 130 comprises a host interface 122 which enables communication with the host 110 for the receipt of commands such as read and write requests, for example. SoC controller 130 also includes a NAND interface 124 for communication with the storage device 140 via a NAND bus coupled to the interface, command and control CuA circuitry 144 comprising the page buffers 145 of the NAND array 142. Further, the SoC controller 130 comprises a (DRAM) memory interface 126 for communication with the memory 150 external to the SoC. Host interface 122 on the SoC 130 may comprise a Serial Advanced Technology Attachment (SATA) connector or a NVMe™ connector (NVMe™ is an acronym for "NVM express," where "NVM" stands for non-volatile memory, hereinafter NVMe) operating with a PCIe® ("Peripheral Component Interface Express," hereinafter PCIe) bus, for example. NAND interface 124 may comprise an Open NAND Flash Interface (ONFI), a toggle NAND interface or a manufacturer's proprietary interface, for example. Memory interface 126 may comprise, for example, an interface according to, but not limited to: a Double Data Rate (DDR) memory bus standard such as DDR3, DDR4 or DDR5; a Low Power Double Data rate (LPDDR) memory bus standard such as LPDDR3, LPDDR4 or LPDDR5; a Hybrid Memory Cube (HMC) memory bus standard.

SoC controller 130 may comprise various internal sub-controllers such as a NVMe controller 132 coupled to the host interface 122, a memory controller 136 coupled to the memory interface 126, and a NAND controller 138 coupled to the NAND interface 124. The NVMe controller 132 may be configured to function in accordance with the NVM Express™ Base Specification (version 1.4) dated Jun. 10, 2019, hereinafter referenced as "NVMe 1.4." The NVMe controller 132 and NAND controller 138 may also be coupled to the memory controller 136 via a data bus. Firmware 134, in which various operational parameters for the SSD 120 may be stored or programmed, may be used to control the operation of, and transfer of data between, the NVMe controller 132, NAND controller 138 and memory controller 136. The firmware 134 may comprise application specific integrated circuit (ASIC) logic that is programmable, programmable firmware running on one or more processors or a combination of both. The firmware 134 may comprise a flash translation layer that enables the SoC controller 130 to perform various activities that facilitate the processing of read and write commands received from the host 110. One such activity may include the orchestration of the data flow for the commands between the NVMe controller 132 and the NAND controller 138. With respect to FIG. 1, the firmware configuration circuit 134 configures and controls the operation and the passing of data between these controllers 132, 136, 138. The NVMe controller 132, memory controller 136, and NAND controller 138 are interconnected by a common bus and controlled by the firmware configuration function circuit 134. Memory controller 136 is connected to the DRAM 150 via the memory interface 126. NAND controller 138 is connected to the NAND interface 124 for communication with the storage device 140, as is shown in FIG. 1. Any interaction between the SoC 130 and the NAND array 142 occurs via the NAND controller 138, the NAND interface 124, and the NAND page buffers 145.

Once the NVMe controller 132 receives commands from the host 110, such as read commands or write commands, for example, it utilizes the settings in the firmware 134 to map the logical block addresses contained in the host commands to physical NAND addresses. The firmware 134 may utilize a look-up table to obtain the required NAND addresses. These NAND addresses are then used in NAND commands, either based on the host commands received or internally generated by firmware, which are sent to the NAND controller 138. In the case of a memory device with multiple page buffers, such as a CuA NAND memory, the NAND controller 138 determines a specific subset of n buffers from the plurality of NAND page buffers 145 available in the interface, command and control CMOS circuit 144 of the memory device 140 for use when processing a command, where n is an integer greater than zero. In some implementations, each of the NAND page buffers 145 have a unique buffer identifier, which the SoC 130 explicitly specifies when processing a command. The NAND controller 138 then uses the NAND addresses to perform an action or function on the memory device 140, as defined by the host or internally generated commands (e.g. garbage collections commands).

When processing commands, the SoC controller 130 issues commands to the memory device 140 to cause a data shift operation between the SoC controller 130 and the NAND page buffers 145, and commands to the memory device 140 to cause a media operation between the memory array 142 and the NAND page buffers 145. Media operations may be performed in parallel with data shift operations. In some implementations, only one media operation is performed at any one time, while any number of data shift operations can occur provided there are sufficient page buffers 145 available in the memory device 140. This is because the time taken to complete a media operation is generally longer than the time taken to complete a data shift operation. For example, a write or program media operation typically takes about two milliseconds, whereas a data shift operation typically takes a few microseconds.

The order of operations performed within the memory device 140 upon receipt of a command from the SoC controller 130 depends on the nature of the command being processed. For example, in the case of a read command received from the host 110, the NAND controller 138 issues one or more read commands to cause one or more media read operations from one or more NAND physical addresses corresponding to one or more logical addresses specified in the read command. Here the NAND controller 138 specifies n NAND page buffers 145 into which a data payload contained at the specified NAND physical address in the NAND array 142 is to be transferred. While a media read operation is being performed between the memory array 142 and the n NAND page buffers 145, the memory device 140 may also perform, in parallel, data shift operations between the SoC controller 130 and the NAND page buffers 145 related to other command received from the SoC controller 130. Once the one or more media read operations are complete, the NAND controller 138 issues a data shift-out command from the n NAND page buffers containing the data payload related to the one or more read commands from the SoC controller 130 for delivery to the SoC controller 130. As with a media read operation, while the data shift-out operation is being performed between the n NAND page buffers 145 and the SoC controller 130, the memory device 140 may also perform, in parallel, media operations between the NAND page buffers 145 and the NAND array 142, related to other commands received from the SoC controller 130.

As another example, in the case of a write command, the NAND controller 138 issues a data shift-in command to transfer a data payload from the SoC controller 130 to the memory device 40. Here the NAND controller 138 specifies n NAND page buffers 145 into which the data payload from the SoC controller 130 is to be transferred. While the data shift-in operation is being performed between the n NAND page buffers 145 and the SoC controller 130, the memory device 140 may also perform, in parallel, media operations between the NAND page buffers 145 and the NAND array 142 related to other commands received from the SoC controller 130. Once the data shift-in operation is complete, the NAND controller 138 issues a command to cause a media write/program operation from the n NAND page buffers 145 containing the data payload to the NAND physical address specified in the write command. As with the data shift-in operation, while the media write operation is being performed between the n NAND page buffers 145 and the NAND array 142, the memory device 140 may perform, in parallel, data shift operations between the SoC controller 130 and the NAND page buffers 145 related to other command received from the SoC controller 130.

Figure 2:
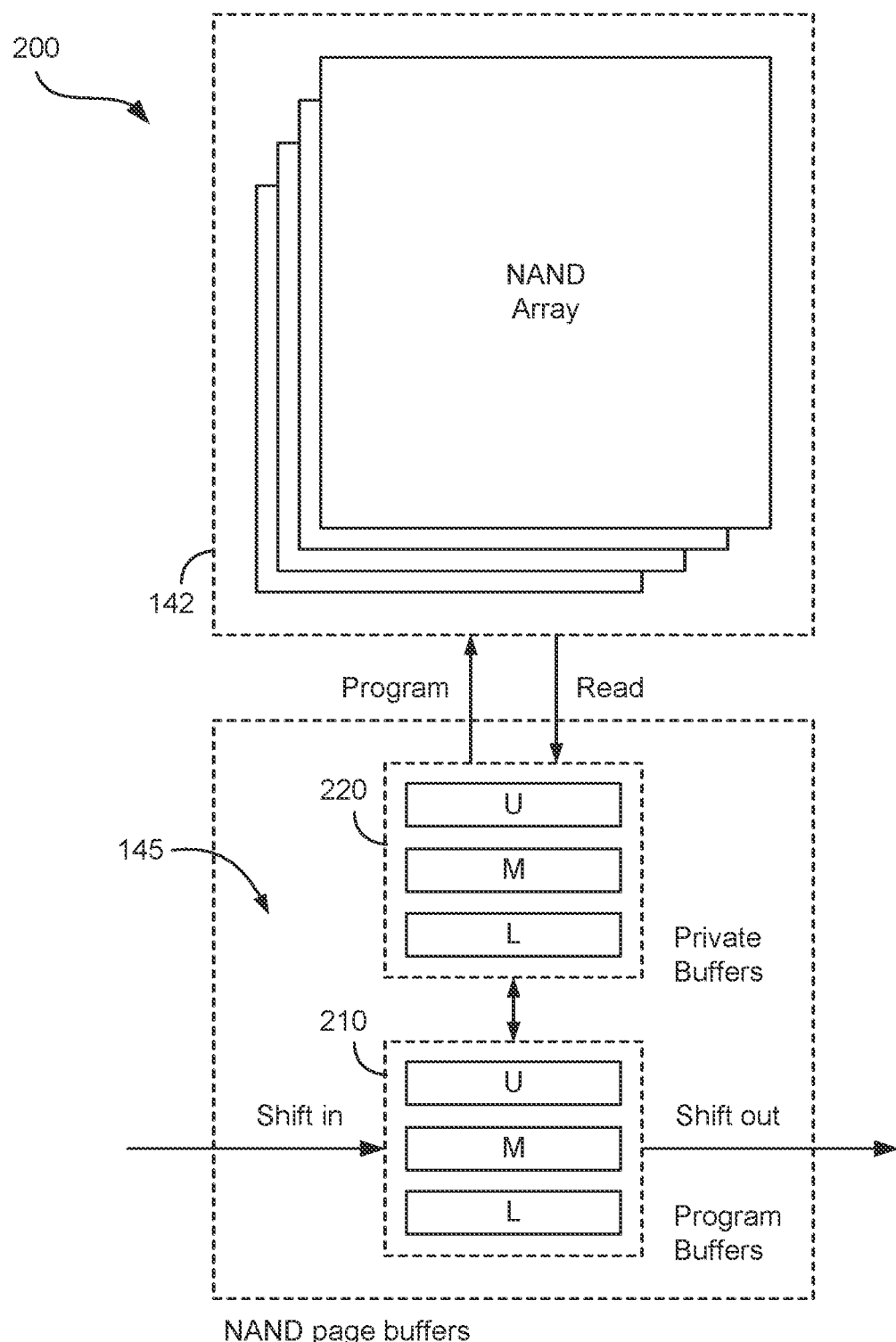
FIG. 2 shows a schematic representation of the memory device in FIG. 1 comprising a memory array and a plurality of always readable page buffers, according to one or more embodiments of the present disclosure.

FIG. 2 illustrates a memory device 200 similar to memory device 140 shown in FIG. 1, configured according to an embodiment of the present disclosure. Like numbered features will not be described again for the sake of brevity. Memory device 200 comprises a plurality of NAND page buffers 145 serving as program buffers 210 and private buffers 220. Program buffers 210 are configured to store data payloads as they are received from the SoC controller 130 or the NAND array 142, and private buffers 220 are configured to encode or decode data payloads as they are transferred to and from the NAND array 142. In the example shown in FIG. 2, the memory device 200 is configured for TLC where each of the program buffers 210 and the private buffers 220 comprise at least an upper page ('U'), a middle page ('M'), and a lower page ('L') for the three bit programming required per memory cell in TLC. In some implementations, a private buffer is assigned for programming each bit of data in a TLC memory cell. Thus in memory device 200, three NAND buffers 145 are assigned as private buffers 220. However there may be a much larger number of NAND buffers 145 assigned as program buffers 210. Further, as the memory array 142 increases, the number of available NAND buffers 145 available for use as program buffers 210 and private buffers scales with the number of NAND dies accordingly.

When the SoC controller 130 issues a data shift-in command to the memory device 200, a data payload is transferred from the SoC controller 130 to a set of program buffers 210. In some implementations, the SoC controller 130 transfers the data payload to a set of program buffers 210 using a fire and forget approach where the SoC controller 130 sends the data payload to the program buffers 210 and discards the original data payload shortly thereafter so as to minimize the usage of the internal write buffer of the controller for storage of the original data payload. In other implementations, the SoC controller 130 sends the data payload to the set of program buffers 210 and retains the original data payload in its internal write buffer until the data payload is written to the NAND array 142.

Once the data payload is transferred to the program buffers 210, the SoC controller 130 issues a media write command to the memory device 200 to cause the data payload in the program buffers 210 to be copied to the private buffers 220 where the data payload is encoded for programming to the NAND array 142. The encoded data payload is then written to the NAND array 142 at a logical address specified by the SoC controller 130. In order to retrieve the data payload from the NAND array 142, the reverse process would be required where the encoded data would have be decoded prior to being shifted out to the SoC controller 130, which is likely to introduce bit errors.

However, in accordance with embodiments of the present disclosure, as the original un-encoded data payload is contained in the program buffers 210, subsequent read commands issued by the SoC controller 130 can be directly serviced from the program buffers 210. This enables quick retrieval of data from the program buffers 210 without requiring a decoding step, or incurring a read delay. This minimizes bit errors during decoding, and also avoids having to suspend media operations between the NAND page buffers 145 and the NAND array 142. Further, in the event of a program status failure (PSF) or a power loss, the original data in the program buffers 210 can be read out quickly to be written elsewhere. In some implementations, the PSF data and power loss protection (PLP) data is written elsewhere in pseudo single-layer cell (pSLC).

Figure 3:
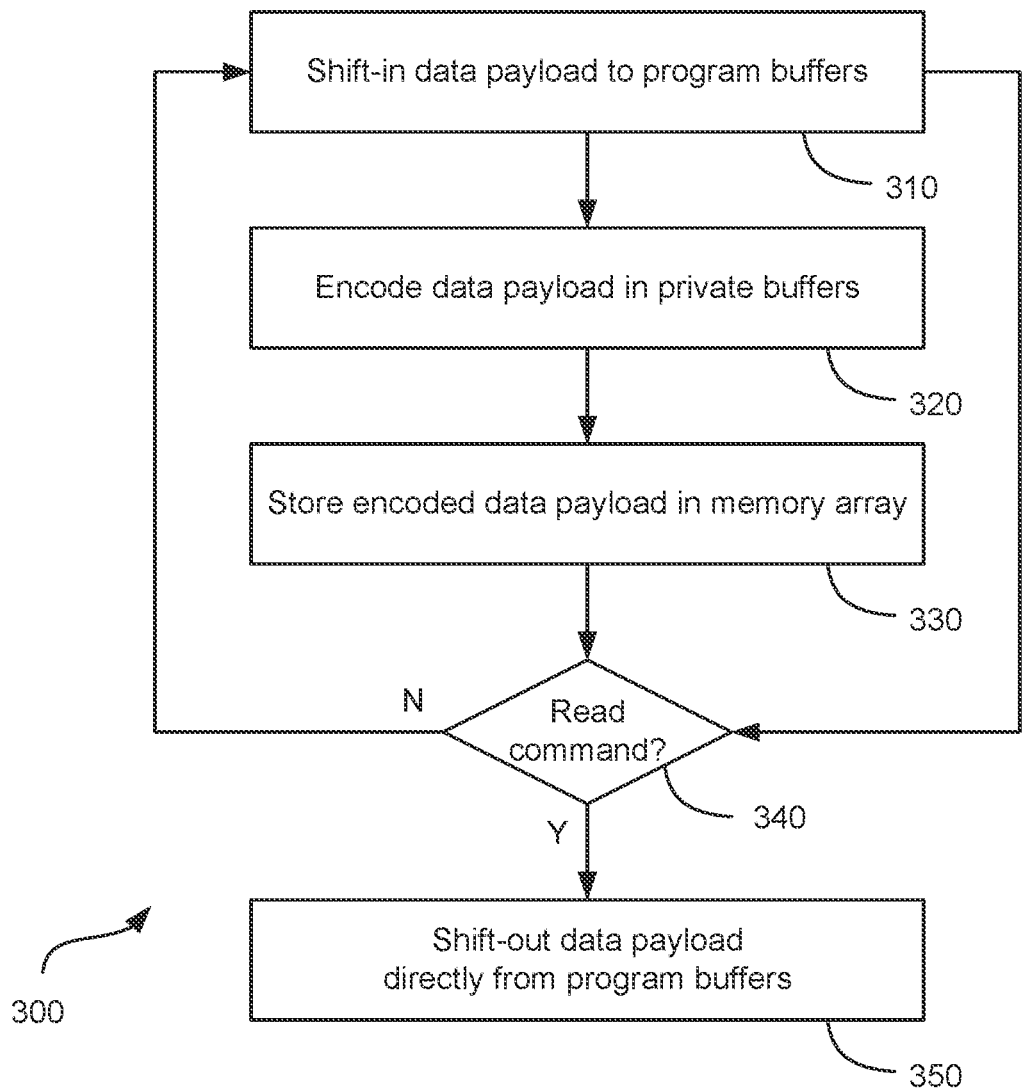
FIG. 3 is a flow diagram of a method of operating a memory device configured as program buffers and private buffers to facilitate maintaining write data payloads that are always readable, according to one or more embodiments of the present disclosure.

FIG. 3 illustrates an exemplary flow diagram of a method 300 for maintaining data payloads as always readable in the memory device 200 of FIG. 2 when processing a media write commands received from the controller 130, according to an embodiment of the present disclosure. The method begins at step 310 where the SoC controller 130 issues a data shift-in write command to the memory device 200 where the write data payload is transferred from the SoC controller 130 to a plurality of program buffers 210. In some implementations, the NAND controller 138 in the SoC controller 130 specifically identifies n NAND page buffers 145 to be used as program buffers 210 in which to transfer the write data payload relating to the shift-in write command. In other implementations, the NAND page buffers 145 are identified by a unique buffer identifier known to the NAND controller 138.

Next in step 320, the SoC controller 130 issues a media write command to the memory device 200 in which the write data payload contained in the program buffers 210 are copied to the private buffers 220 in the memory device 200 where the payload is encoded in accordance with the NAND array memory cell structure, e.g. TLC. The encoded data payload is then stored in the NAND array 142 at a logical address specified by the SoC controller 130 (step 330). As the original data payload is still retained in the program buffers 210 in un-encoded form, when the SoC controller 130 subsequently issues a media read command (i.e. 'Y' at step 340), the data payload is shifted-out directly from the program buffers 210 instead of retrieving the data payload from the NAND array 142 (step 350).

Figure 4:
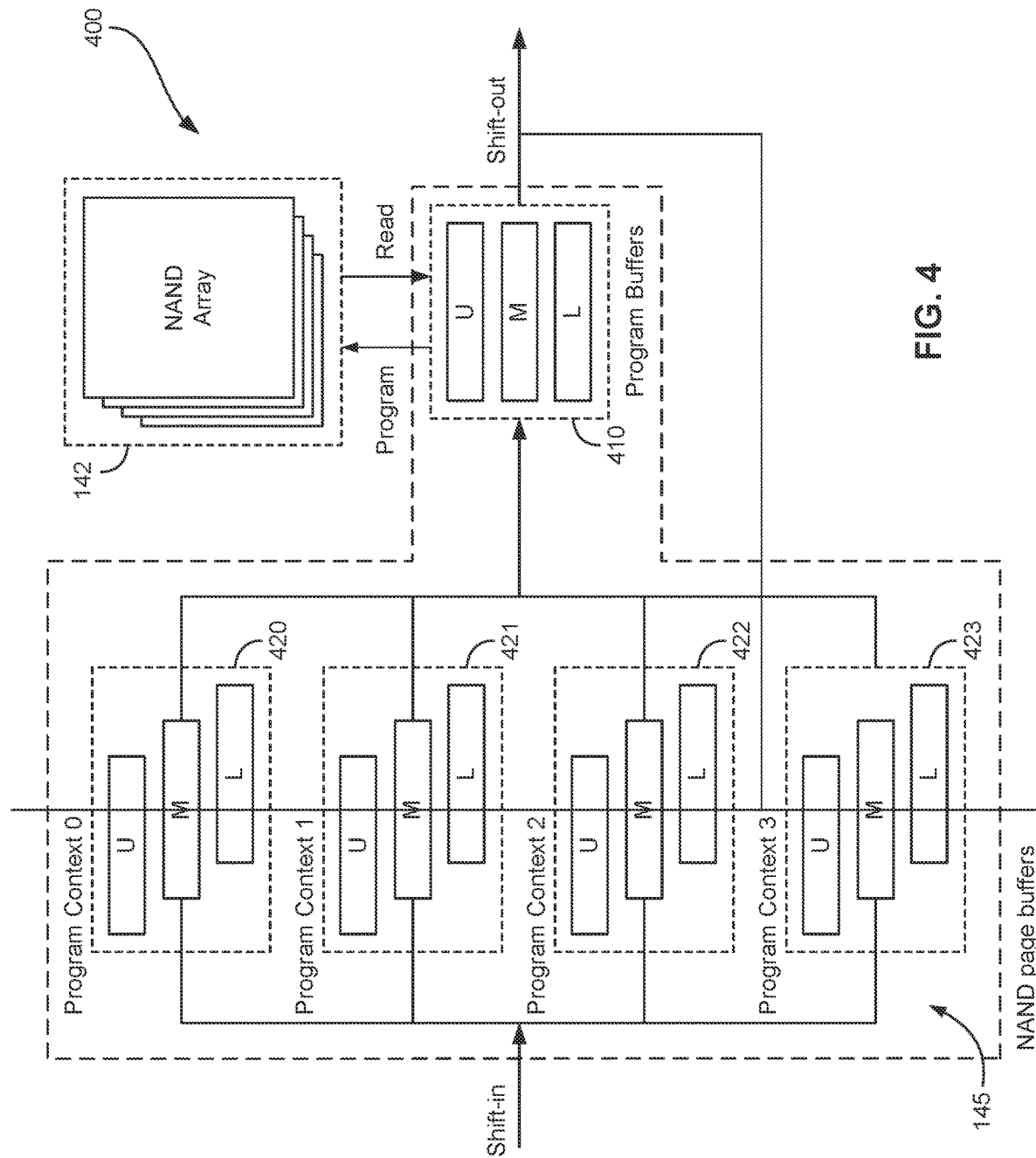
FIG. 4 shows a schematic representation of the memory device in FIG. 1 configured as program context buffers, according to one or more embodiments of the present disclosure.

FIG. 4 illustrates a memory device 400 similar to memory device 140 shown in FIG. 1, configured according to another embodiment of the present disclosure. Like numbered features will not be described again for the sake of brevity. Memory device 400 supports multiple program contexts and comprises a plurality of NAND page buffers 145 serving as program buffers 410 and program context buffers 420-423. Program context buffers 420-423 are dedicated to specific program contexts as running within the SSD, such as, for example, a host thread, a garbage collection thread, and an SSD management thread. In FIG. 4 program context buffers 420-423 are assigned to program contexts 0-3, respectively. Note that each of the program context buffers 420-423 may each comprise as many NAND page buffers as required by the memory cell structure of the NAND array 142. In the case of TLC, the program context buffers 420-423 each comprise three NAND page buffers, as shown in FIG. 4.

Program context buffers 420-423 are configured to receive data payloads from the SoC controller 130 in a data shift-in operation. The data payloads are shifted into the respective program context buffers 420-423 based on the program thread from which they originate. This information may be determined by the SoC 130 and relayed to the memory device 400 via the NAND controller 138. When the SoC controller 130 issues a data shift-in command to the memory device 400, a data payload is transferred from the SoC controller 130 to a set of program context buffers 420-423, depending on the program thread from which the data originated. For example, if the data payload originated from a host thread, and if the NAND controller 138 has reserved program context buffers 421 in context 1 for data payloads originating from a host thread, the data payload received therein would be transferred to the program context buffers 421.

Data payloads accumulate in the program context buffers 420-423 as they are shifted in from the SoC controller 130 until all the program context buffers for a program context are in receipt of a data payload. In the case of the TLC memory device 400, once the context buffers for a particular program context 0-3 contain data payloads, the SoC controller 130 issues a media write command to the memory device 400 to cause the data payload in program context buffers corresponding to a specific program thread to be copied to the program buffers 410. Here the data payload is encoded for TLC and subsequently written to the NAND array 142 at a logical address specified by the SoC controller 130. In order to retrieve the data payload from the NAND array 142, the reverse process would occur via a media read command issued by the SoC controller 130, where the encoded data would have be decoded prior to being shifted out to the SoC controller 130.

As with the memory device 200, as the original un-encoded data payload is contained in the program context buffers 420-423, subsequent read commands issued by the SoC controller 130 can be directly serviced from the program context buffers 420-423. This enables quick retrieval of data from the program context buffers 420-423 without requiring a decoding step which would be necessary when reading the data payload out from NAND array 142. This minimizes bit errors during decoding, and also avoids having to suspend media operations between the NAND page buffers 145 and the NAND array 142. Further, as data payloads for multiple program threads are stored in the program context buffers 420-423 until a media write command is issued by the SoC controller 130, the program context buffers 420-423 effectively function as program/write cache support for the memory device 400.

Figure 5:
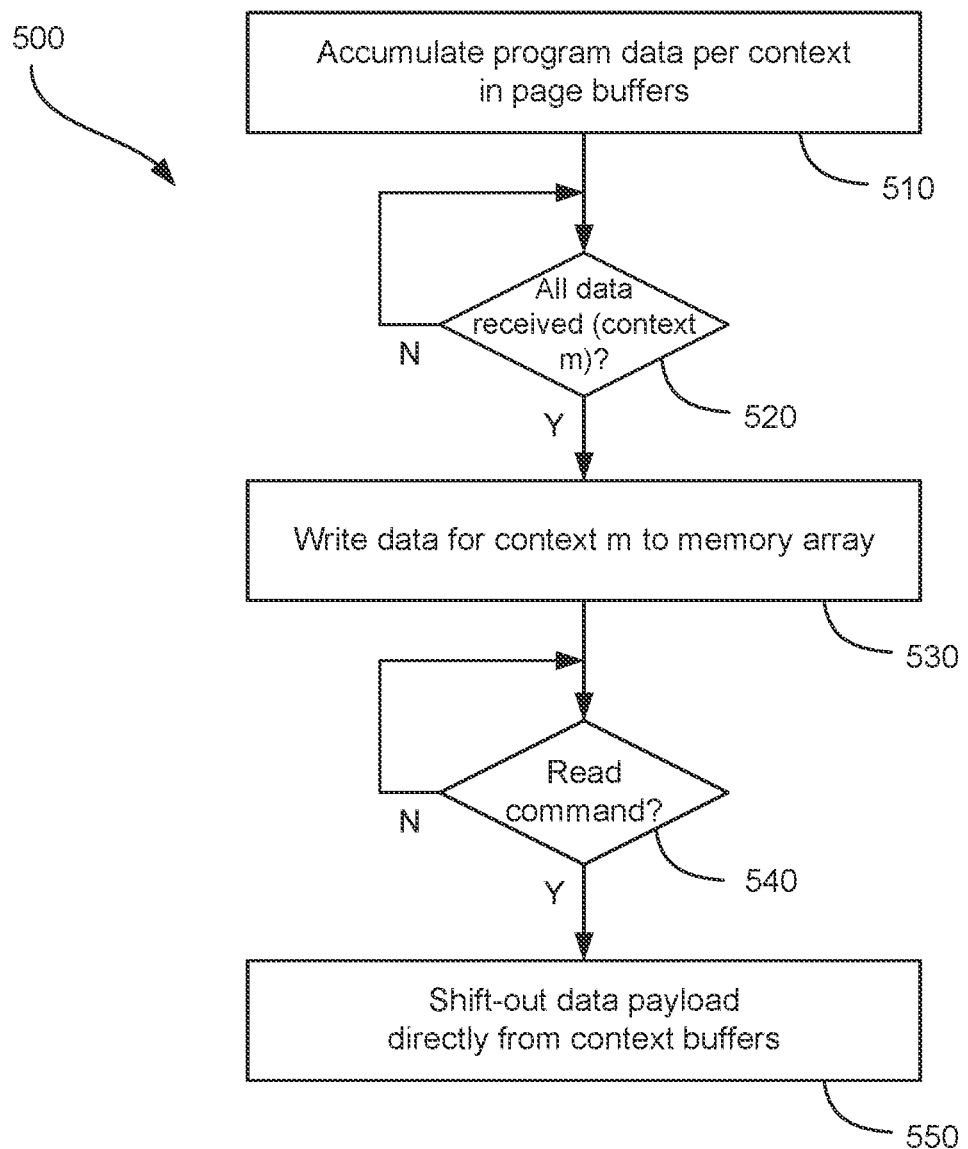
FIG. 5 is a flow diagram of a method of operating a memory device configured to provide cache program support, according to one or more embodiments of the present disclosure.

FIG. 5 illustrates an exemplary flow diagram of a method 500 for using NAND page buffers in memory 400 of FIG. 4 for program/write cache support, according to an embodiment of the present disclosure. The method begins at step 510 where the SoC controller 130 issues data shift-in write commands to the memory device 400 for a plurality of program contexts, such as program contexts 0-3 as shown in FIG. 4, for example. As previously mentioned, program contexts may be exemplified as a host thread, a garbage collection thread, and an SSD management thread. The write data payloads for the respective program contexts are transferred from the SoC controller 130 and accumulated in an associated program context buffer 420-423. Once the data payload for a specific program context m has been fully transferred to the relevant program context buffer 420-423, i.e. 'Y' at step 520, the SoC controller 130 issues a media write command to the memory device 400 in which the write data payload contained in the program context buffers 420-423 for program context m is copied to the program buffers 410 where the payload is encoded in accordance with the NAND array memory cell structure, e.g. TLC, and stored in the NAND array 142 at a logical address specified by the SoC controller 130 (step 530). It should be noted that if the data payload for program context m has not been fully received in program context buffers 420-423, i.e. 'N' at step 520, the SoC controller 130 continues to shift-in data to the program context buffers 420-423. As the original data payload for program context m is still retained in the program context buffers 420-423 in un-encoded form, when the SoC controller 130 subsequently issues a media read command (i.e. 'Y' at step 540), the data payload is shifted-out directly from the relevant program context buffer 420-423 instead of retrieving the data payload from the NAND array 142 (step 550).

Figure 6:
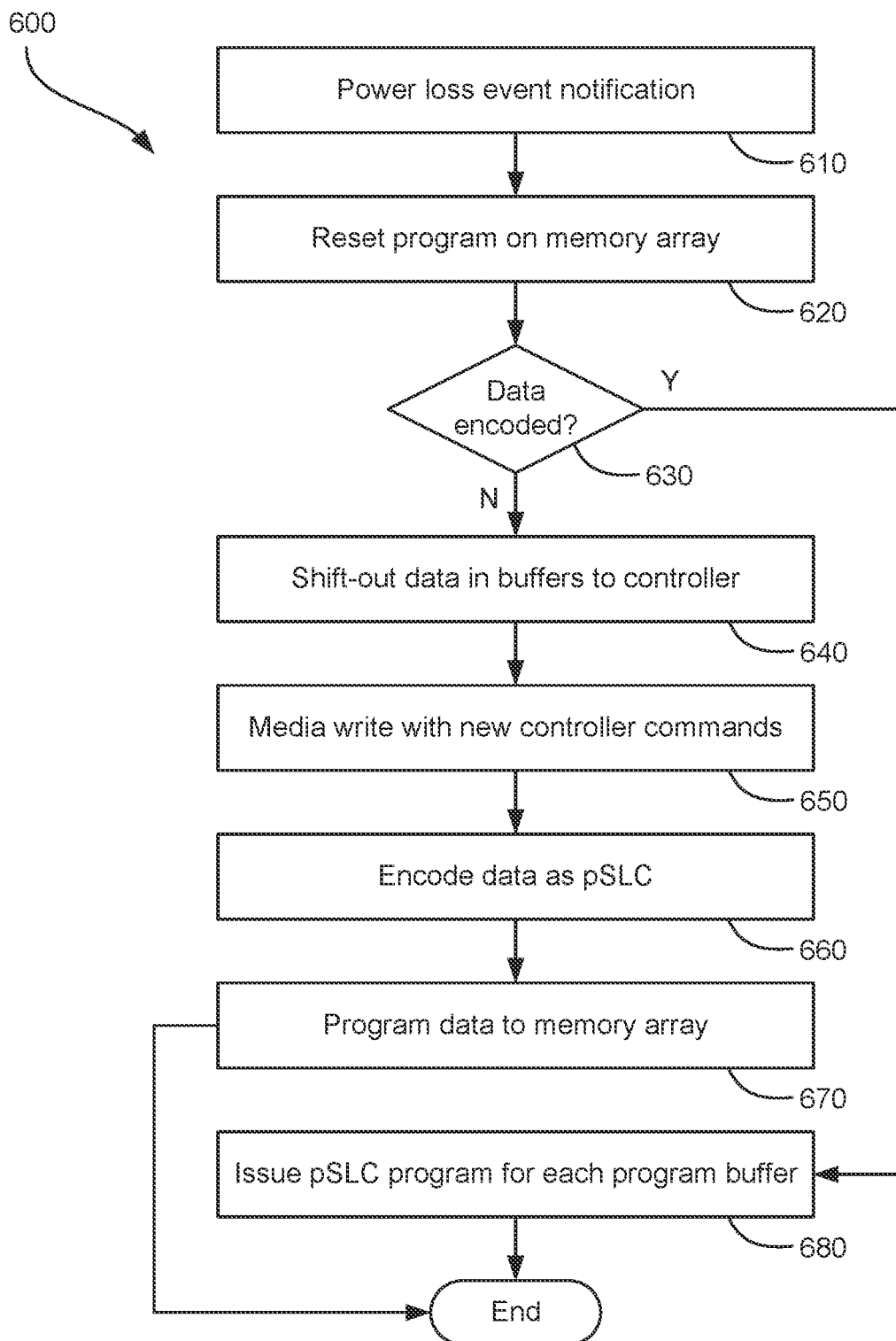
FIG. 6 is a flow diagram of a method of operating a memory device configured with power loss protection (PLP), according to one or more embodiments of the present disclosure.

FIG. 6 illustrates an exemplary flow diagram of a method 600 for operating a memory device, such as memory device 140 in FIG. 1, with power loss protection (PLP), according to an embodiment of the present disclosure. When a power failure event occurs, the SSD has a very limited amount of time to salvage any data payload in the program buffers (e.g. program buffers 210, 410) that has yet to be written to the NAND array 142 before the data payload is lost. Often PLP capacitors are employed in SSDs to lengthen the time from notification of power failure to actual depletion of power so as to allow the SoC controller 130 to allocate resources to write data payloads to the NAND array 142. However such components add to the overall complexity and cost of the SSD and should ideally be minimized.

The method begins at step 610 where the SoC controller 130 is notified of a power loss event. The SoC controller 130 then issues a command to reset the programming of the memory array 142, per step 620, where the current program/write operation is stopped. The SoC controller 130 may not instruct the memory device 140 to clear the program buffers. In step 630, the SoC controller 130 determines if the data payload in the program buffers are readable and not corrupted with the encoding of the previous program/write prior to reset. If the data payload is readable and not encoded, i.e. 'N' at step 630, the SoC controller 130 issues a data shift-out command to transfer the data payload from the program buffers directly to the SoC controller 130, as shown in step 640. For TLC, data payloads for all of the upper, middle and lower pages in the program buffers are shifted out to the SoC controller 130. On receipt of the data payload, the SoC controller 130 issues new media write commands in step 650 where the data payload for each TLC page is shifted-in to the program buffers. The data payload for each NAND page is then encoded in pSLC (step 660) and stored in the NAND array 142 (step 670). However if the data payload in the program buffers have been encoded, i.e. 'Y' at step 630, the SoC controller 130 determines if the encoded data can be re-used as the source of a pSLC program, and, if so, issues a media write command to the memory device 140 to cause the program buffer to write the encoded data for each of the NAND pages to the NAND array 142 as pSLC, per step 680.

Some NAND programming methodologies involve multi-step programming, where data payloads are written to the NAND array 142 several times, and at various intensities, to avoid the programming voltage from disturbing the charge held in neighboring cells in the memory array 142. In some implementations, for a program disturb distance d is known, and when programming to the NAND array 142, all memory cells along the program disturb distance are programmed. For example, for a TLC program disturb distance of 5 cells, data for a total of 5×3 NAND pages would be required for multi-step programming. Data for these 15 pages would be programmed/written to the NAND array 142 in z steps, where z is an integer. Thus the original data payload involved needs to be available during this time to avoid having to obtain the data payload from the controller at each step of programming.

Figure 7:
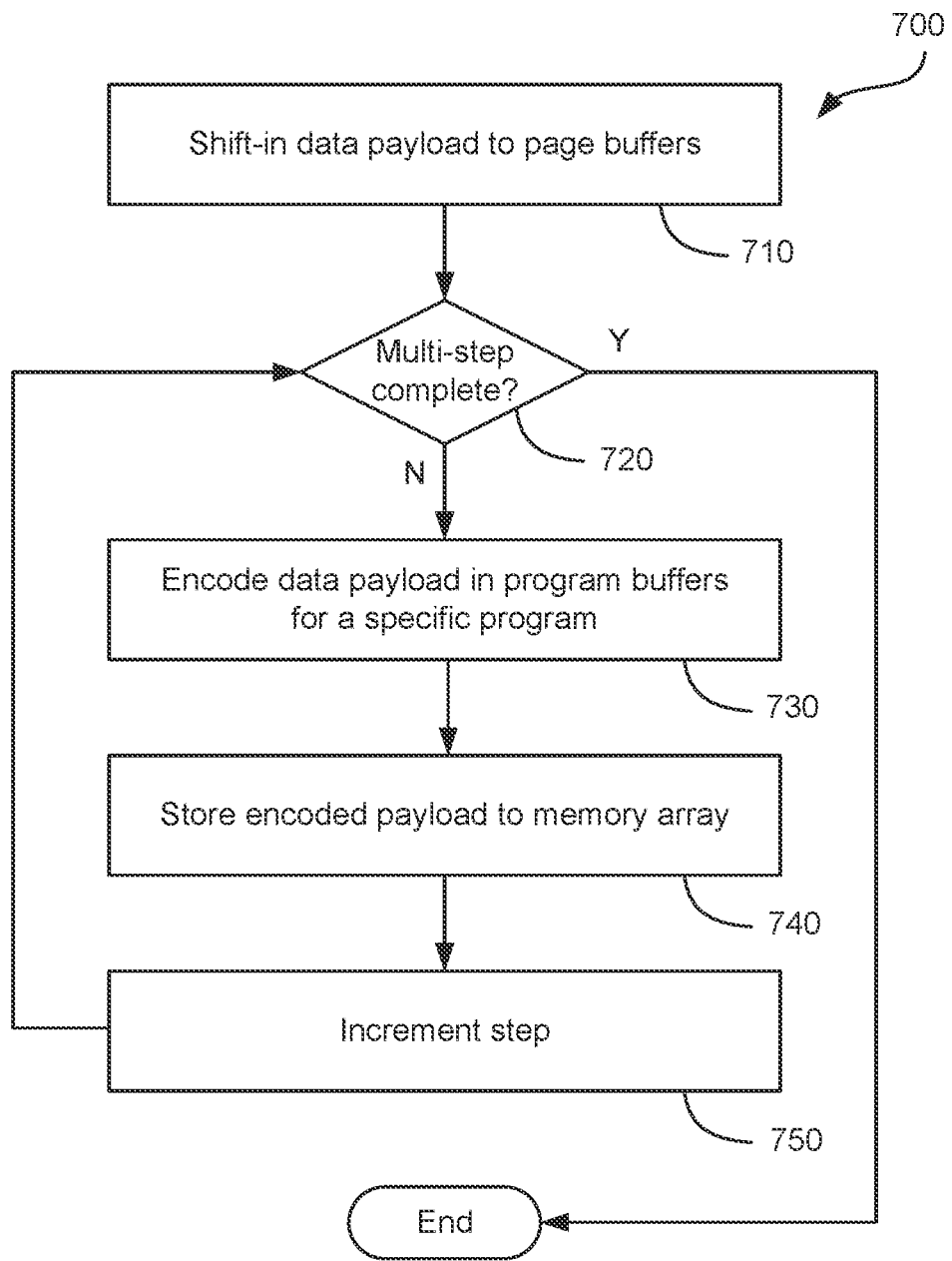
FIG. 7 is a flow diagram of a method of operating a memory device configured for multi-step programming, according to one or more embodiments of the present disclosure.

FIG. 7 illustrates an exemplary flow diagram of a method 700 for operating a memory device, such as memory device 140 in FIG. 1, for multi-step programming, according to an embodiment of the present disclosure. The method begins in step 710 where the SoC controller 130 issues a shift-in command to cause the memory device 140 to transfer data payloads subject to a program/write command to NAND page buffers 145. For example for a memory array storing n bits per memory cell and a disturb distance of d, the SoC controller 130 instructs the memory device 140 to shift in data payloads into n×d NAND page buffers.

For each step of a multi-step program comprising z steps (decision step 720), the SoC controller 130 issues a media program/write command to cause the memory array 140 to encode the data payload contained in n NAND page buffers of the n×d NAND page buffers in the program buffer (such as buffers 210, 410) of the NAND array 140, per step 730. The memory device 140 then stores the encoded data payload in the NAND array 142. The method 700 then increments z in step 750, and cycles back to step 720 where the SoC controller 130 determines if all the z steps of the multi-step program have completed. If they have not, i.e. 'N' at step 720, the steps 730, 740 and 750 are repeated until all of the data payloads in the n×d NAND page buffers 145 are stored in the NAND array 142. When all data payloads for the multi-step program have been stored in the NAND array 142, i.e. 'Y' at step 720, the method ends.

An exemplary multi-step programming sequence is provided in string lines 1-12 listed below. This is an example of a 1:3:3 TLC multi-step program, where the data payloads are written to the NAND array 142 in two stages, each with varying weights. In lines 1-5, the SoC controller 130 shifts-in data payloads to NAND page buffers with buffer IDs 0-4, followed by a program/write of the associated data payloads to the NAND array 142, per Step #1. Next, in line 6 of the program sequence, the SoC controller 130 then shifts-in data payloads to NAND page buffers with buffer IDs 6,7, followed by a program/write of the associated data payloads, and previous payload in the NAND page buffer with buffer ID 0, to the NAND array 142, per Step #2. In this manner, the data payload contained in buffer ID 0 was already available in a NAND page buffer, and so the memory device 140 did not need to request the data payload again from the SoC controller. The same can be seen in lines 8, 10 and 12 of the program sequence. It should be noted that the NAND page buffers with buffer IDs 6 and 7 in lines 6, 8, 10 and 12 contain different data payloads as the immediately preceding line in the sequence writes the contents of these NAND page buffers to the NAND array 142.

1. Data-Shift write to buffer 0 then Media Program Step #1 WL0/Str0 buffers(0)
2. Data-Shift write to buffer 1 then Media Program Step #1 WL0/Str1 buffers(1)
3. Data-Shift write to buffer 2 then Media Program Step #1 WL0/Str2 buffers(2)
4. Data-Shift write to buffer 3 then Media Program Step #1 WL0/Str3 buffers(3)
5. Data-Shift write to buffer 4 then Media Program Step #1 WL1/Str0 buffers(4)
6. Data-Shift write to buffer 6,7 then Media Program Step #2 WL0/Str0 buffers(0,6,7)
7. Data-Shift write to buffer 5 then Media Program Step #1 WL1/Str1 buffers(5)
8. Data-Shift write to buffer 6,7 then Media Program Step #2 WL0/Str1 buffers(1,6,7)
9. Data-Shift write to buffer 0 then Media Program Step #1 WL1/Str1 buffers(0)
10. Data-Shift write to buffer 6,7 then Media Program Step #2 WL0/Str1 buffers(2,6,7)
11. Data-Shift write to buffer 1 then Media Program Step #1 WL1/Str1 buffers(1)
12. Data-Shift write to buffer 6,7 then Media Program Step #2 WL0/Str1 buffers(3,6,7)

An further exemplary multi-step programming sequence is provided in string lines 1-16 listed below. This is an example of a QLC multi-step program with a disturb distance of 5, where the data payloads are written to the NAND array 142 in two stages, each with varying weights. In lines 1-5, the SoC controller 130 shifts-in 5×4 data payloads to NAND page buffers with buffer IDs 0-19, followed by a program/write of the associated data payloads to the NAND array 142, per Step #1. Next, in line 6 of the program sequence, the SoC controller 130 then programs/writes the data payloads in NAND page buffers with buffer IDs 0-3 again for Step #2 of Program0. Multi-step program for Program0 is now complete and the NAND page buffers with buffer IDs 0-3 are now cleared to be reused. Here the SoC controller 130 shifts-in new data payloads to these NAND page buffers as seen in sequence line 7 and programs/writes them to the NAND array 142 for Step #1 of program5. Skipping down the program sequence, Step #2 of Program5 is seen in line 16 which completes Program5, and the NAND page buffers with buffer IDs 0-3 are once again cleared to be reused.
1. Buffer (00,01,02,03) Program0 Step #1
2. Buffer (04,05,06,07) Program1 Step #1
3. Buffer (08,09,10,11) Program2 Step #1
4. Buffer (12,13,14,15) Program3 Step #1
5. Buffer (16,17,18,19) Program4 Step #1
6. Buffer (00,01,02,03) Program0 Step #2
7. Buffer (00,01,02,03) Program5 Step #1
8. Buffer (04,05,06,07) Program1 Step #2
9. Buffer (04,05,06,07) Program6 Step #1
10. Buffer (08,09,10,11) Program2 Step #2
11. Buffer (08,09,10,11) Program7 Step #1
12. Buffer (12,13,14,15) Program3 Step #2
13. Buffer (12,13,14,15) Program8 Step #1
14. Buffer (16,17,18,19) Program4 Step #2
15. Buffer (16,17,18,19) Program9 Step #1
16. Buffer (00,01,02,03) Program5 Step #2

By utilizing the NAND page buffers 145 in this manner, the multi-step programming can be performed without the interruption caused and bit errors introduced from having to shift-in and re-read the original data payloads after each step of the multi-step program.

Figure 8:
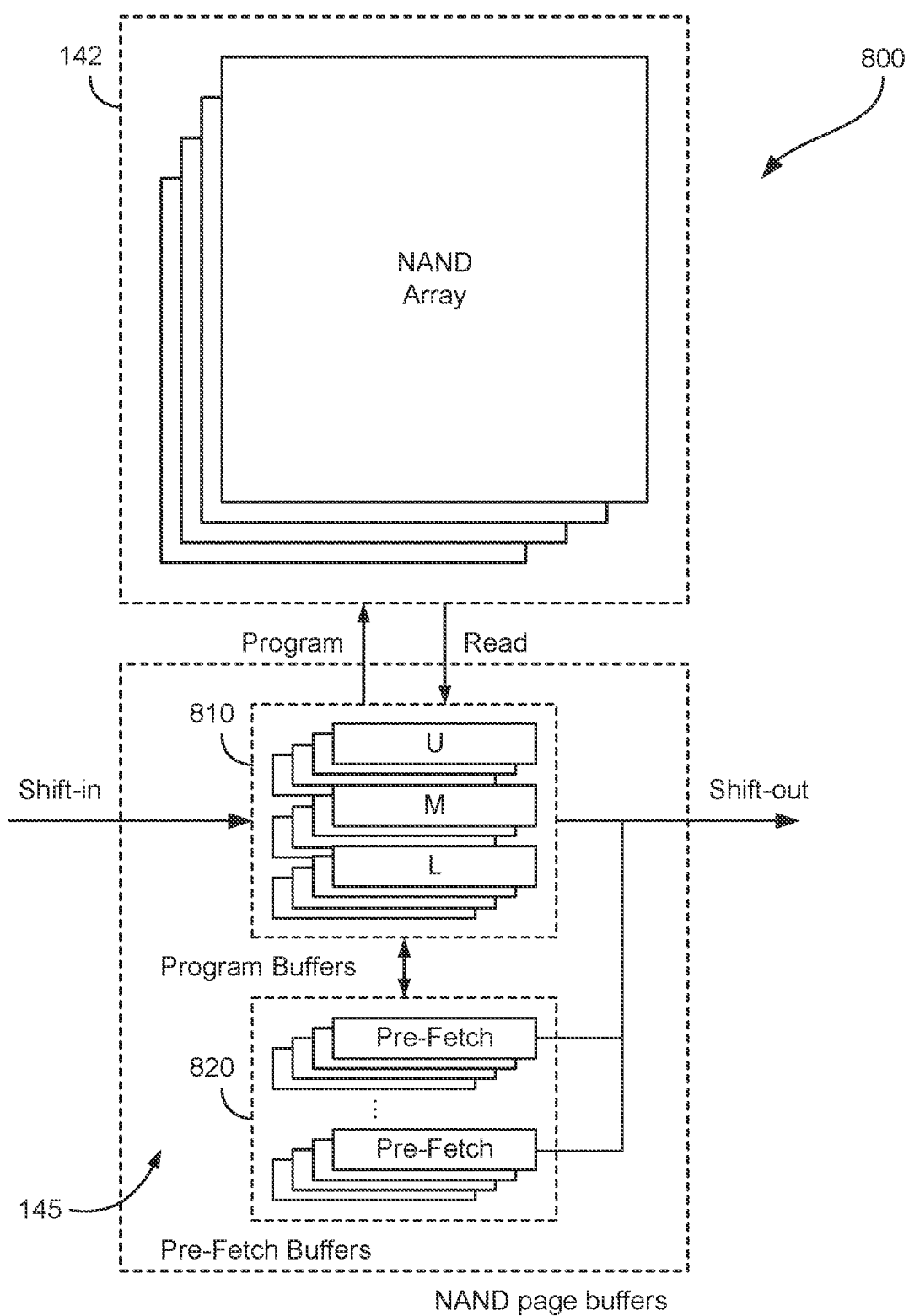
FIG. 8 shows a schematic representation of the memory device in FIG. 1 comprising a memory array and a plurality of pre-fetch page buffers, according to one or more embodiments of the present disclosure.

It may be desirable to pre-fetch data payloads from the NAND array 142 to avoid read delays for low queue depth sequential read operation. Conventionally, for such sequential read operations, the associated data payloads are read from the NAND array and stored in the SRAM read buffer within the controller, for delivery to a host at a later time. This wastes the resources of the controller, and unnecessarily over utilizes the power and bus bandwidth especially in the case of speculative reads. These issues are overcome by utilizing the NAND page buffers to store the data payloads from a sequential read operation. FIG. 8 illustrates a memory device 800 similar to memory device 140 shown in FIG. 1, configured for pre-fetching of data payloads in sequential read operations, and read caching, according to another embodiment of the present disclosure. Like numbered features will not be described again for the sake of brevity.

Memory device 800 comprises a plurality of NAND page buffers 145 serving as program buffers 810 and pre-fetch buffers 820. Program buffers 810 are configured to store data payloads as they are received from the NAND array 142 when the SoC controller issues a media read command to the memory device 800. In the example shown in FIG. 8, the memory device 800 is configured for TLC programming where each of the program buffers 810 receives a data payload from the NAND array 142 for each of the upper, middle and lower bits of the TLC. The data payload is then decoded in the program buffers 810, and shifted out to the SoC controller 130.

For a sequential read, the SoC controller 130 extracts the logical address associated with the initial media read command, and determines a plurality of sequential logical addresses for a given queue depth. The queue depth can be specified in the firmware 134 of the SoC controller 130. The NAND controller 138 then determines the status of the NAND planes in the NAND array 142 for each of the sequential addresses. If a NAND plane is idle, the SoC controller 130 issues a media read command to cause the memory device 800 to retrieve the data payload at a sequential address and store the data payload in a pre-fetch buffer 820. The SoC controller 130 repeatedly does this for all idle NAND planes identified by the sequential addresses, and stores the resulting data payloads in the pre-fetch buffers 820. If the SoC controller 130 receives a read request for a data payload from a sequential address, it issues a media read command and causes the memory device 800 to retrieve the associated data payload from the pre-fetch buffer 820, decode and shift-out the data payload to the SoC controller 130. By doing so, the SoC controller 130 reduces read delays from the NAND array 142 as the data payloads are already speculatively pre-fetched. Further shift-out and error correction need only be performed on a pre-fetched data payload that actually becomes the subject of a media read operation. Such pre-fetching of data payloads serve as a read cache. Further, by retaining the data payloads in the pre-fetch buffers 820 until needed, the high read disturb SRAM is no longer utilized for such reach caching, thereby preventing read disturb in the SSD.

Figure 9:
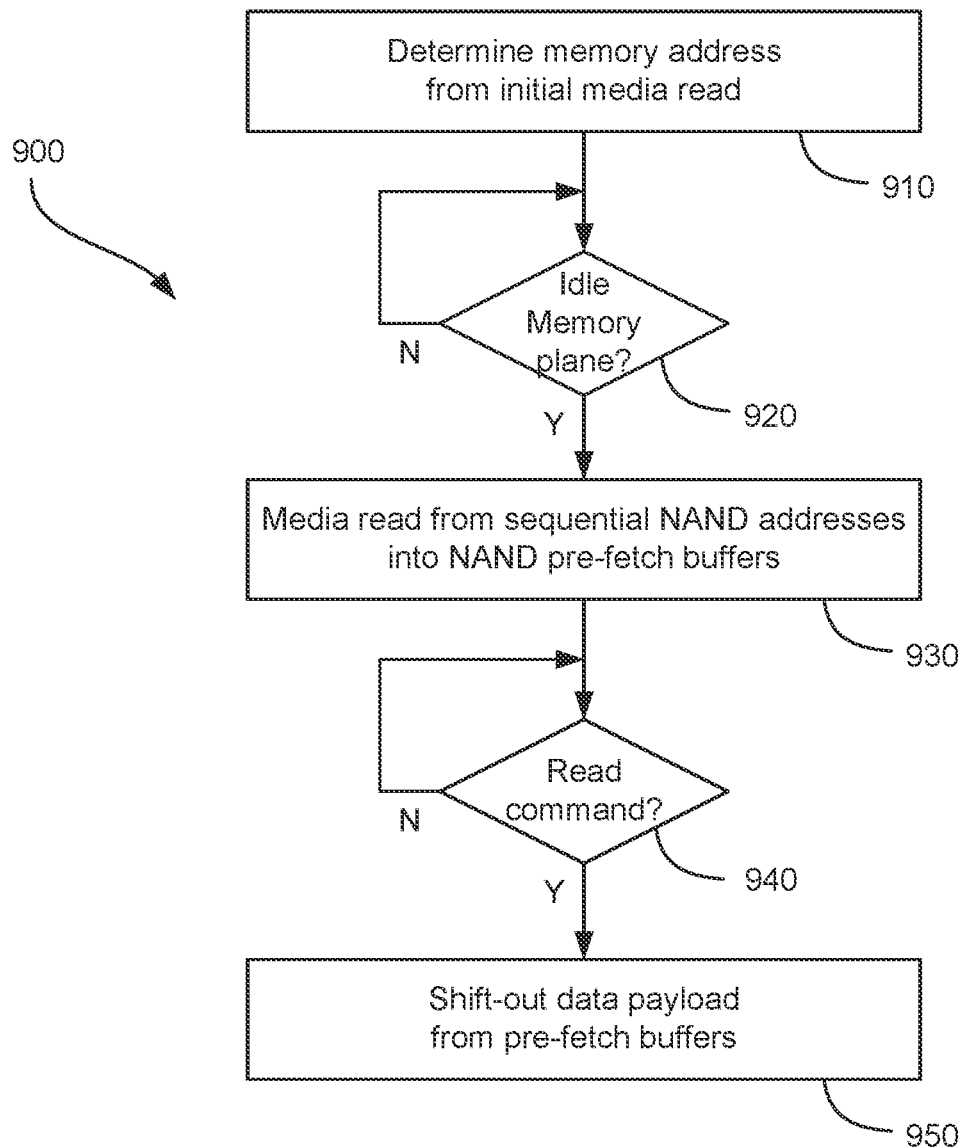
FIG. 9 is a flow diagram of a method of operating a memory device configured for sequential read and cache read operations, according to one or more embodiments of the present disclosure.

FIG. 9 illustrates an exemplary flow diagram of a method 900 for pre-fetching data payloads in the memory device 800 of FIG. 8 when processing a media read commands received from the controller 130, according to an embodiment of the present disclosure. The method begins at step 910 where the SoC controller 130 determines the logical address associated with an initial media read command, and determines a plurality of sequential logical addresses for a given queue depth. Next, the SoC controller 130 determines if any of the sequential addresses is contained in NAND plane that is idle. If a sequential address is in an idle NAND plane, i.e. 'Y' at step 920, the SoC controller 130 issues a media read command to cause the memory device 800 to read the data payload at the sequential address into a pre-fetch buffer 820. If there are no idle NAND planes, i.e. 'N' at step 920, the SoC controller 130 keeps checking for an idle NAND plane in the memory array 142. If the SoC controller 130 receives a read request for a data payload from a sequential address, i.e. 'Y' at step 940, it issues a media read command and causes the memory device 800 to retrieve the associated data payload directly from the pre-fetch buffer 820, and decode the data payload to be shifted out to the SoC controller 130, per step 950.

In the foregoing, all recitation of "layer" and "engine" should be taken to mean a plurality of circuits within the controller that facilitates the function as described. Such circuits may comprise electronic components formed on a semiconductor chip, such as, for example, transistors and resistors. It should be noted that the term "about" or "approximately" in the foregoing indicates a range of ±20% of the stated value. Additionally, in the foregoing, all recitation of "command," "action" or "function" should be taken to be based on algorithms and instructions stored on a non-transitory computer-readable medium, that, when executed by a processor, causes a controller of an integrated circuit of a solid-stated drive (SSD) to perform the command, action or function. Further, in the foregoing, the terms "write" and "program" may be used interchangeably in relation to command, and both relate to the function of transferring a data payload to a specific physical address in a memory device. In general, in relation to the above disclosure, for memory arrays comprising memory cells that each store y bits per cell, where y is any integer, then n=y. For example, for single-level memory cells (SLCs), n=1, for multi-level memory cells (MLCs), n=2, for triple-level memory cells (TLCs), n=3, for quad-level memory cells (QLCs), n=4, and for variable-level memory cells (VLCs), n=5.

Other objects, advantages and embodiments of the various aspects of the present invention will be apparent to those who are skilled in the field of the invention and are within the scope of the description and the accompanying Figures.

For example, but without limitation, structural or functional elements might be rearranged consistent with the present invention. Similarly, principles according to the present invention could be applied to other examples, which, even if not specifically described here in detail, would nevertheless be within the scope of the present invention.

The invention claimed is:

1. A memory storage system comprising:
a non-volatile semiconductor memory device comprising a memory array and a plurality of buffers; and
a controller in communication with the plurality of buffers, and configured to issue a first command to the non-volatile semiconductor memory device to cause a transfer of a data payload from the controller to a subset of n first buffers of the plurality of buffers, the data payload to be encoded by the non-volatile semiconductor memory device,
wherein the controller is further configured to issue a second command to the non-volatile semiconductor memory device to cause the data payload in the subset of n first buffers to be encoded in n second buffers of the plurality of buffers separate from the n first buffers, and stored in the memory array.

2. The memory storage system of claim 1, wherein the controller is further configured to issue a third command to the non-volatile semiconductor memory device to cause the transfer of unencoded data payload directly from the first n buffers to the controller.

3. The memory storage system of claim 1, wherein the controller is further configured to issue a third command to the non-volatile semiconductor memory device to cause the transfer of unencoded data payload directly from the n first buffers to the controller when the controller is in receipt of any one of: a notification of a program status fail (PSF) signal, and notification of a power loss event.

4. The memory storage system of claim 3, wherein the controller is configured to re-encode the data payload for a pseudo single layer cell (pSLC) to be written in the memory array.

5. The memory storage system of claim 1, wherein the first command and the second command are combined into a single command issued by the controller.

6. The memory storage system of claim 1, wherein the memory array comprises memory cells that each store at least one bit per cell.

7. The memory storage system of claim 6, wherein the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs).

8. The memory storage system of claim 1, wherein the non-volatile semiconductor memory device is a CMOS under Array (CuA) NAND semiconductor memory.

9. The memory storage system of claim 1, wherein the controller comprises a system-on-chip (SoC) controller.

10. A memory storage system comprising:
a non-volatile semiconductor memory device comprising a memory array and a plurality of buffers; and
a controller in communication with the plurality of buffers, and configured to issue a first command to the non-volatile semiconductor memory device to cause a transfer of a data payload from the controller to a subset of n first buffers of the plurality of buffers,
wherein the first command causes transfer of the data payload to a subset of n first buffers of the plurality of buffers for each memory cell of the memory array within a disturb distance of d cells.

11. The memory storage system of claim 10, wherein for each step in a programming cycle comprising z steps, the controller is further configured to issue a second command to the non-volatile semiconductor memory device to cause a data payload in a subset of n first buffers of n×d first buffers to be encoded in n second buffers of the plurality of buffers separate from then first buffers, and stored in the memory array.

12. The memory storage system of claim 11, wherein the programming cycle comprises two or more steps for programming.

13. The memory storage system of claim 10, wherein the memory array comprises memory cells that each store at least one bit per cell.

14. The memory storage system of claim 13, wherein the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs).

15. The memory storage system of claim 10, wherein the non-volatile semiconductor memory device is a CMOS under Array (CuA) NAND semiconductor memory.

16. The memory storage system of claim 10, wherein the controller comprises a system-on-chip (SoC) controller.

17. A memory storage system comprising:
a non-volatile semiconductor memory device comprising a memory array and a plurality of buffers; and
a controller in communication with the plurality of buffers, and configured to:
issue a fourth command to the non-volatile semiconductor memory device to cause the non-volatile semiconductor memory device to transfer a data payload from the memory array to a subset of n first buffers of the plurality of buffers,
issue a third command to cause the transfer of the data payload contained in the subset of n first buffers to the controller,
determine an address of the data payload in the memory array, and a plurality of subsequent sequential addresses in the memory array for a specified queue depth, and
transfer data payloads at each of the subsequent sequential addresses to a plurality of n fourth buffers of the plurality of buffers separate from the n first buffers.

18. The memory storage system of claim 17, wherein the controller is configured to issue a third command to the non-volatile semiconductor memory device to cause the transfer of a data payload associated with a subsequent sequential address directly from a respective plurality of n fourth buffers to the controller.

19. The memory storage system of claim 17, wherein the memory array comprises memory cells that each store at least one bit per cell.

20. The memory storage system of claim 19, wherein the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs).

21. The memory storage system of claim 17, wherein the third command and the fourth command are combined into a single command issued by the controller.

22. The memory storage system of claim 17, wherein the non-volatile semiconductor memory device is a CMOS under Array (CuA) NAND semiconductor memory.

23. The memory storage system of claim 17, wherein the controller comprises a system-on-chip (SoC) controller.

24. A memory storage system comprising:
a non-volatile semiconductor memory device comprising a memory array and a plurality of buffers; and
a controller in communication with the plurality of buffers, and configured to:
issue a first command to the non-volatile semiconductor memory device to cause a transfer of data payloads from the controller to a subset of n first buffers of the plurality of buffers, and
process data payloads from a plurality of programs and accumulate data payloads relating to each program in a plurality of n third buffers of the plurality of buffers separate from the n first buffers.

25. The memory storage system of claim 24, wherein the first command initially causes a transfer of data payloads from the n third buffers relating to a program m of the plurality of programs to the subset of n first buffers.

26. The memory storage system of claim 25, wherein the controller is further configured to issue a second command to the non-volatile semiconductor memory device to cause the data payload for program m in the n first buffers to be stored in the memory array.

27. The memory storage system of claim 25, wherein the controller is configured to issue a third command to transfer a data payload directly from the plurality of n third buffers associated with a program to the controller.

28. The memory storage system of claim 25, wherein the plurality of programs may comprise any one of: a host program, a garbage collection program, and a management program.

29. The memory storage system of claim 24, wherein the memory array comprises memory cells that each store at least one bit per cell.

30. The memory storage system of claim 29, wherein the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs).

31. The memory storage system of claim 24, wherein the non-volatile semiconductor memory device is a CMOS under Array (CuA) NAND semiconductor memory.

32. The memory storage system of claim 24, wherein the controller comprises a system-on-chip (SoC) controller.

33. A memory storage system comprising:
a non-volatile semiconductor memory device comprising a memory array and a plurality of buffers; and
a controller in communication with the plurality of buffers, and configured to:
issue a first command to the non-volatile semiconductor memory device to cause a transfer of data payloads from the controller to a subset of n first buffers of the plurality of buffers, and
issue a reset command to the non-volatile semiconductor memory device upon receipt of a notification of a power loss event,
wherein upon receipt of a notification of a power loss event, the controller is further configured to re-encode the data payload contained in the plurality of n first buffers as pSLC, and program the pSLC encoded data payload to the memory array.

34. The memory storage system of claim 33, wherein if the data payload contained in the plurality of n first buffers has already been encoded to be programmed to the memory array, the controller is further configured to issue new commands to re-encode the data payload in each of the n first buffers as pSLC.

35. The memory storage system of claim 33, wherein if the data payload contained in the plurality of n first buffers has not already been encoded to be programmed to the memory array, the controller is further configured to issue a third command to transfer the data payload to the controller, followed by a first command to transfer the same data payload to the plurality of n first buffers as pSLC.

36. The memory storage system of claim 33, wherein the memory array comprises memory cells that each store at least one bit per cell.

37. The memory storage system of claim 36, wherein the memory array comprises single-level memory cells (SLCs), pseudo single-level memory cells (pSLC), multi-level memory cells (MLCs), triple-level memory cells (TLCs), quad-level memory cells (QLCs) or variable-level memory cells (VLCs).

38. The memory storage system of claim 33, wherein the non-volatile semiconductor memory device is a CMOS under Array (CuA) NAND semiconductor memory.

39. The memory storage system of claim 33, wherein the controller comprises a system-on-chip (SoC) controller.

* * * * *